(12) United States Patent
Priel et al.

(10) Patent No.: US 8,018,247 B2
(45) Date of Patent: Sep. 13, 2011

(54) APPARATUS AND METHOD FOR REDUCING POWER CONSUMPTION USING SELECTIVE POWER GATING

(75) Inventors: Michael Priel, Hertzelia (IL); Dan Kuzmin, Givat Shmuel (IL); Michael Zimin, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 685 days.

(21) Appl. No.: 11/720,129

(22) PCT Filed: Nov. 30, 2004

(86) PCT No.: PCT/EP2004/014917
§ 371 (c)(1),
(2), (4) Date: Aug. 11, 2008

(87) PCT Pub. No.: WO2006/058559
PCT Pub. Date: Jun. 8, 2006

(65) Prior Publication Data
US 2009/0003114 A1    Jan. 1, 2009

(51) Int. Cl.
*H03K 17/16* (2006.01)
*H03K 19/00* (2006.01)
*G11C 5/14* (2006.01)

(52) U.S. Cl. .............................. 326/34; 326/93; 327/530

(58) Field of Classification Search .................. 326/83, 326/86, 93, 96, 112; 327/530
See application file for complete search history.

(56) References Cited

U.S. PATENT DOCUMENTS

| | | | |
|---|---|---|---|
| 5,614,847 A * | 3/1997 | Kawahara et al. | 326/98 |
| 5,933,384 A * | 8/1999 | Terada et al. | 365/227 |
| 6,169,419 B1 | 1/2001 | De et al. | |
| 6,292,015 B1 * | 9/2001 | Ooishi et al. | 326/33 |
| 6,501,300 B2 * | 12/2002 | Hatae | 326/93 |
| 7,215,155 B2 * | 5/2007 | Won | 326/98 |
| 7,649,405 B2 * | 1/2010 | Wang et al. | 327/544 |
| 7,737,720 B2 * | 6/2010 | Idgunji et al. | 326/33 |
| 2002/0186040 A1 | 12/2002 | Ooishi | |
| 2004/0070427 A1 | 4/2004 | Miyagi | |
| 2007/0063763 A1 * | 3/2007 | Yoo et al. | 327/544 |

FOREIGN PATENT DOCUMENTS

| | | |
|---|---|---|
| JP | H05-027879 A | 2/1993 |
| JP | H09-230967 A | 9/1997 |
| JP | 2001-147746 A | 5/2001 |

OTHER PUBLICATIONS

Kao et al; "MTCMOS Sequential Circuits"; 27th European Solid-State Circuits Conference, Sep. 2001, Austria.

* cited by examiner

*Primary Examiner* — Shawki S Ismail
*Assistant Examiner* — Dylan White

(57) ABSTRACT

A method and apparatus for reducing power consumption of transistor-based circuit is disclosed. The method includes receiving a low power mode indication; determining whether to supply power to at least a portion of the transistor-based circuit in response to a reset value of the transistor-based circuit and a state of the transistor-based circuit prior the receiving of the low power mode indication, and selectively providing power to at least a portion of the transistor-based circuit. The apparatus is adapted to receive a low power mode indication, and includes: a determining circuit to determine whether to supply power to at least a portion of the transistor-based circuit in response a state of the transistor-based circuit prior the receiving of the low power mode indication; and a power gating, adapted to selectively provide power to at least a portion of the transistor-based circuit in response to the determination.

16 Claims, 2 Drawing Sheets

APPARATUS AND METHOD FOR REDUCING POWER CONSUMPTION USING SELECTIVE POWER GATING

FIELD OF THE INVENTION

The present invention relates to apparatuses and methods for reducing power consumption of transistor-based systems.

BACKGROUND OF THE INVENTION

Mobile devices, such as but not limited to personal data appliances, cellular phones, radios, pagers, lap top computers, and the like are required to operate for relatively long periods before being recharged. These mobile devices usually include one or more processors as well as multiple memory modules and other peripheral devices.

The power consumption of a transistor-based device is highly influenced by leakage currents that flow through the transistor. The leakage current is responsive to various parameters including the threshold voltage (Vt) of the transistor, the temperature of the transistor and the like. Transistors that have higher Vt are relatively slower but have lower leakage currents while transistors that have lower Vt are relatively faster but have higher leakage current.

In order to reduce the power consumption of mobile devices various power consumption control techniques were suggested. A first technique includes reducing the clock frequency of the mobile device. A second technique is known as dynamic voltage scaling (DVS) or alternatively is known as dynamic voltage and frequency scaling (DVFS) and includes altering the voltage that is supplied to a processor as well as altering the frequency of a clock signal that is provided to the processor in response to the computational load demands (also referred to as throughput) of the processor. Higher voltage levels are associated with higher operating frequencies and higher computational load but are also associated with higher energy consumption.

A third technique uses domino circuits that include both high threshold voltage transistors and low threshold voltage transistors. U.S. patent application number 2004/0008056 of Kursun et al., which is incorporated herein by reference, discloses a domino circuit that is configured such as to reduce power consumption, for example by limiting the energy consumed during power switching.

Yet another technique is based upon creating a stack effect that involves shutting down multiple transistors of the same type that are serially connected to each other. U.S. Pat. No. 6,169,419 of De et al., which is incorporated herein by reference, discloses a method and apparatus for reducing standby leakage current using a transistor stack effect. De describes a logic that has both a pull up path and a pull down path.

There is a growing need to find effective apparatuses and methods for reducing power consumption of integrated circuits.

SUMMARY OF THE PRESENT INVENTION

A method and an apparatus for reducing power consumption of a transistor-based circuit, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

It is noted that although the following example refers to MOSFET transistors this is not necessarily so as transistors that are manufactured by other processes can be represented by reference circuits.

The term "transistor-based circuit" refers to a circuit that include one or more transistors and can include various logic gates, memory circuits and the like.

The following examples refer to a standby mode as well as another high power mode and to a reset state of a transistor-based circuit. It is noted that the method can be applied, mutatis mutandis, to an integrated circuit in which there are multiple operational modes that are characterized by different power consumption level.

The invention also can be applied mutatis mutandis, to integrated circuit in which a control signal, such as but not limited to a reset signal, is generated when entering a certain operational mode (or just before entering said mode) and where the control signal can affect the state of transistor-based circuits. It is further noted that different transistor-based circuits can receive different operational mode indication signals.

The phrase "reset state" refers to a value of an output signal of a transistor-based circuit when entering a high power mode.

The invention provides a method for selectively providing power to a memory circuit wherein the selection is responsive to the state of said memory circuit prior entering a low power mode.

Figure 1:
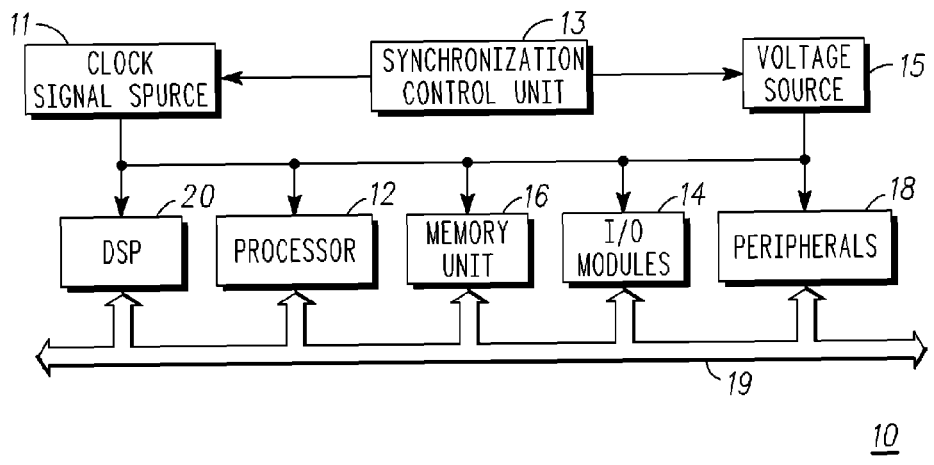
FIG. 1 illustrates a system, according to an embodiment of the invention.

FIG. 1 is a schematic illustration of a system, such as an integrated circuit, 10 that includes various devices that each may include a large number of power reduction apparatuses 12, according to an embodiment of the invention.

System 10 includes various devices such as general purpose processor 12, I/O module 14, memory unit 16, peripherals 18, digital signal processor (DSP) 20. These devices are linked to each other by various lines and buses and receive clock signals and power supply from one or more sources, such as clock signal source 11 and voltage source 15.

According to an embodiment of the invention the clock signal source 11 and the voltage source 15 are also connected to a synchronization control unit 13 that matches between the clock frequency and supplied voltages, such as to prevent a case in which the voltage supplied to and devices is too low to support the clock frequency of the clock signal. This matching is useful when altering the operational mode of the integrated circuit and applying DVFS techniques.

Typically system 10 includes multiple busses and lines and the various devices of system 10 can be connected to the same bus, but this is not necessarily so. For convenience of explanation FIG. 1 illustrates a system but that is common to devices 12, 14, 16, 18 and 20.

It is noted that system 10 can have various configurations and that the devices illustrated in FIG. 1 represent only a single exemplary configuration of system that applies the power gating technique. Typically, system 10 is includes within a mobile device such as a cellular phone.

Modern integrated devices such as processor 12 and DSP 20 can include millions of transistors. System 10, or at least some of its devices (such as but not limited to processor 12 and DSP 20) can operate in various operational modes, including low power modes such as but not limited to an idle mode or standby mode. During a standby mode it is desired to reduce the power consumption of a device, especially in view of the low computational load imposed on said device during said mode.

Typically, once system 10, or one of its devices (it is assumed for convenience of explanation that processor 12 makes this decision) decides to enter a standby mode it issues a STANDBY signal indicating that it is entering (or is about to enter) such a low power mode. It is noted that devices can issue local STANDBY signal as well as global STANDBY signals, and can issue ACTIVE signals instead of STANDBY signals, or a combination of both. For simplicity of explanation it is assumed that a device asserts a STANDBY signal once it enters a low power mode (or just before entering such a mode) and that it negates said signal once it exits the low power mode.

It is also assumed that in some cases (for example, when the low power mode is a standby mode) the device asserts a RESET signal when it exits the low power mode. As mentioned above the signal can be a global signal, a local signal and the like. Typically, the RESET signal is asserted once the device is turned on.

By using power gating techniques the system 10 can shut down many transistor-based circuits, such as but not limited to memory circuits, logic gates and the like, thus reducing the power consumed during standby mode. In some case substantially the whole memory circuit is shut down but in other cases only a portion of the memory circuit is shut down.

Typically, the state of many transistors or transistor-based circuits is affected by a reset signal. Typically such transistor-based circuits receive a RESET signal or a derivative of said signal, or are connected to circuitry such as but not limited to pull up circuitry or pull down circuitry that affect and even determine their state.

According to an embodiment of the invention, a transistor-based circuit can be shut down without losing information, if its reset state equals its state prior entering the standby mode. In other words, power consumption can be reduced by performing power gating in response to a known reset state and in response to the state of the transistor-based circuit prior entering the standby mode.

Figure 2:
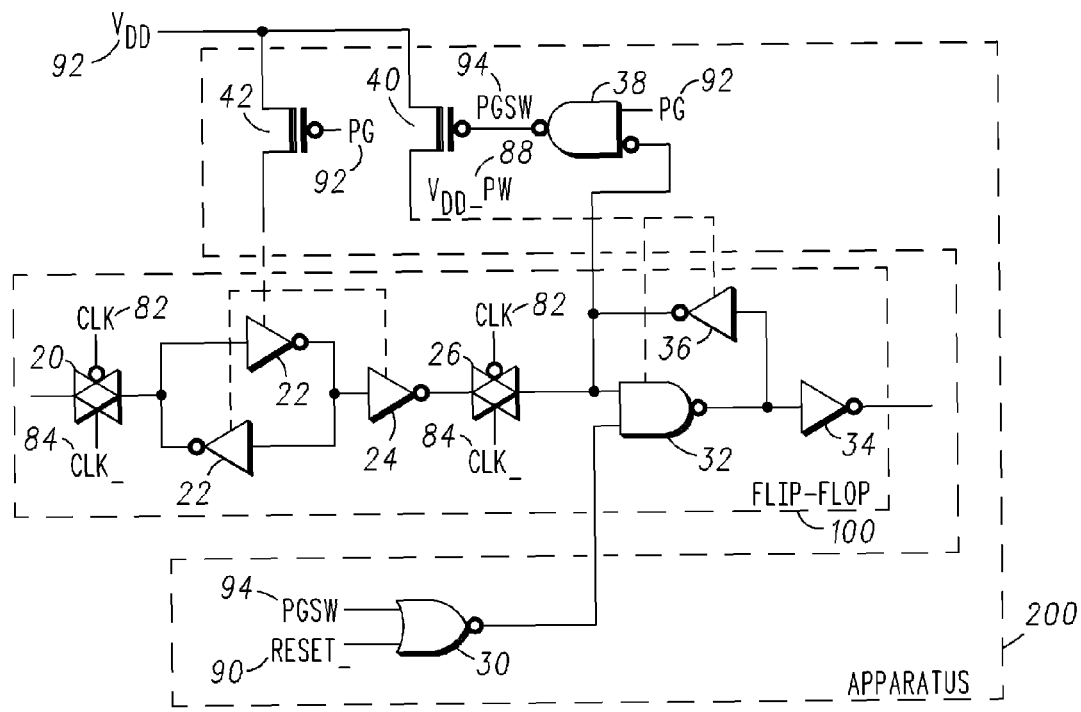
FIG. 2 is a schematic diagram of an apparatus, according to an embodiment of the invention.

FIG. 2 illustrates a transistor-based logic such as flip-flop 100 and a power reduction apparatus 200 according to an embodiment of the invention.

Apparatus 200 includes a determining circuit, such as second NAND gate 38 that is adapted to determine whether to supply power to at least a portion of the flip-flop 100 in response a state of flip-flop 100 prior the receiving of the low power mode indication. Apparatus 200 further includes a power gating circuit, such as transistors 40 and 42 that are adapted to selectively provide power to at least a portion of the transistor-based circuit in response to the determination.

Conveniently, apparatus 200 includes a reset circuit, such as NOR gate 30 that is adapted to affect the reset state of the transistor-based circuit. According to an embodiment of the invention the NOR gate 30 is responsive to a state of flip-flop 100 prior the receiving of the low power mode indication.

Flip-flop 100 includes two serially connected register cells. The second register cell is selectively shut down during standby mode while the first register cell is shut down during standby mode.

An input node of first buffer 20 forms the input node of flip-flop 100. The output of the first buffer 20 is connected to a first and a second invertors 22 that are connected in parallel to each other such that the input of one inventor is connected to an output of the second inverter. These two inverters 22 are connected to a third inverter 24 that in turn is connected to a second buffer 26. The output of the second buffer 26 is connected to a first input of a first NAND gate 32. The output of the first NAND gate 32 is connected to a forth inverter 34 and to a fifth inverter 36. The output of the fifth inverter 36 is connected the first input of the first NAND gate 32 and to a first inverting input of a second NAND gate 38. The second input of the second NAND gate 38 is connected to receive a low power mode indication such as signal PG 92. The output of the second NAND gate 38 is connected to the gate of a PMOS transistor 40 that is connected between a supply source $V_{DD}$ 42 and various components of flip-flop 100 such as fourth and fifth inverters 34 and 36 and first NAND gate 32. The output signal (PGSW 94) of the second NAND gate 38 is provided to a first input of a NOR gate 30. The second input of that NOR gate 30 receives an inverted RESET signal (RESET_ 90). The output of the NOR gate is connected to the second input of the first NAND gate 32.

Each buffer 20 and 26 receives a CLK signal 86 and an inverted CLK signal (CLK_ 84). CLK_ 84 is generated by providing a NOR gate (not shown) a clock signal as well as an inverted low power mode indication (PG_ 80).

The NOR gate 30, second NAND gate 38 and the PMOS transistor 40 provide a feedback loop that controls the supply of power to the second register cell. When RESET_ 90 is one it forces the output of flip-flop 100 to be zero, thus if the state of the flip-flop 100 before entering a standby mode is zero the flip flop 100 can be shut down during standby mode.

Figure 3:
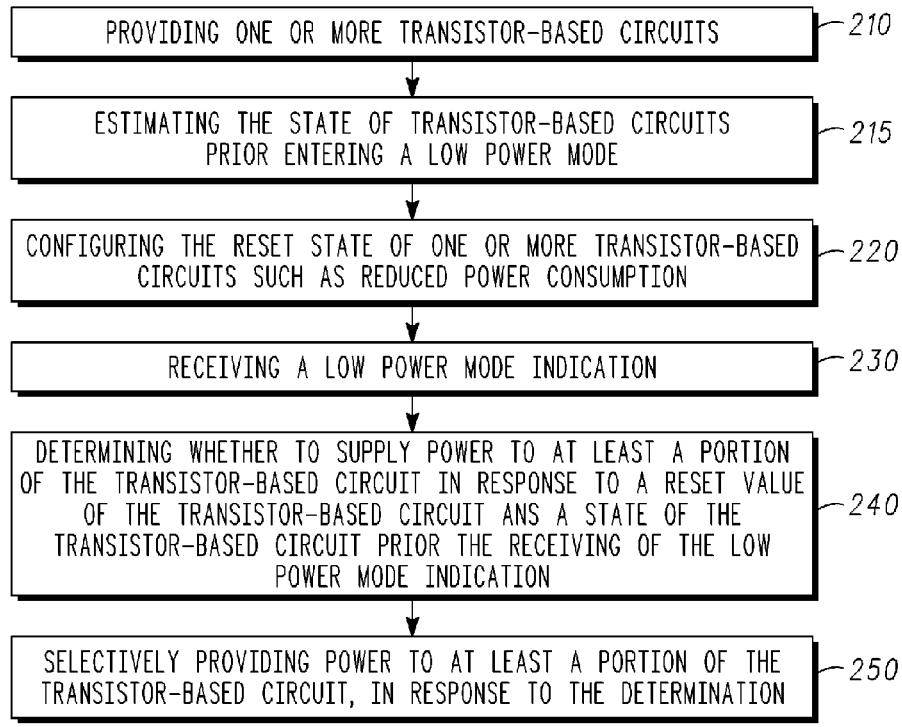
FIG. 3 is a timing diagram illustrating various signals, according to an embodiment of the invention.

FIG. 3 is a flow chart of method 200 for reducing power consumption of one or more transistor-based circuits, according to an embodiment of the invention. Conveniently, a transistor-based circuit is a memory circuit that includes one or more register cells. It is noted that method 200 is usually applied in an environment that includes many transistor-based circuits, but it can also be applied to reduce the power consumption of a single transistor-based circuit.

Method 200 starts by stage 210 of providing one or more transistor-based circuits.

Stage 210 is followed by stage 215 of estimating the state of transistor-based circuits prior entering a low power mode.

Stage 215 is followed by stage 220 of configuring the reset state of one or more transistor-based circuits such as to reduce power consumption. Conveniently, this stage includes configuring reset circuitry such as to increase the probability that the reset state of one or more transistor-based circuits equals their corresponding states prior entering the low power mode. The configuration can include designing pull up paths or pull down paths, as well as determining the signals provided to the transistor-based circuits when entering the low power mode and when exiting such a mode. The determination can be done using prior art simulation and analysis tools.

The power reduction conveniently includes shutting down at least a portion of the transistor-based circuits during the low power more. For example, a first register cell of a flip-flip can be shut down during the low power mode while a second register cell is selectively shut down, depending upon its reset value and its actual state before entering a low power mode.

Conveniently, the certain amount of transistor-based circuits that are shut down exceeds a half of the overall amount of transistor-based circuits.

Referring to the example set forth in FIG. 2, the reset state is determined by NOR gate 30 that receives RESET_ 90.

Stage 220 is followed by stage 230 of receiving a low power mode indication. Referring to the example set forth in FIG. 2, the negation of PG 92 indicates that a standby mode is entered.

Stage 230 is followed by stage 240 of determining whether to supply power to at least a portion of the transistor-based circuit in response to a reset value of the transistor-based circuit and a state of the transistor-based circuit prior the receiving of the low power mode indication. Stage 240 usually includes providing a feedback signal representative of the state of the transistor-based circuit to a power gating circuit. Referring to the example set forth in FIG. 2 the determination is made by the second NAND gate 38 is connected to the gate of a PMOS transistor 40

Stage 240 is followed by stage 250 of selectively providing power to at least a portion of the transistor-based circuit, in response to the determination. Referring to the example set forth in FIG. 2, the output value of the second NAND gate 38 determines whether to supply voltage to the second register cell of flip-flop 100. The first register cell of flip-flop 100 is shut down during the standby mode.

Figure 4:
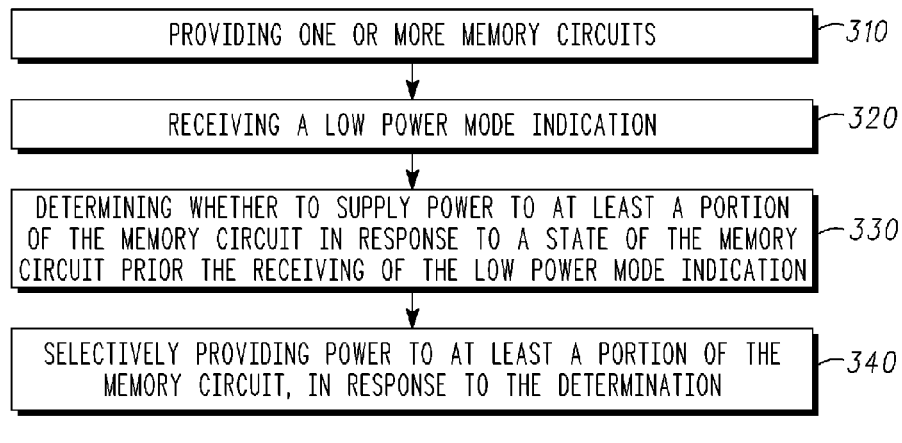
FIG. 4 is a flow chart of a method for reducing power consumption, according to various embodiments of the invention.

FIG. 4 is a flow chart of method 300 for reducing power consumption of one or more memory circuit, according to an embodiment of the invention.

Method 300 starts by stage 310 of providing one or more memory circuits.

Stage 310 is followed by stage 320 of receiving a low power mode indication. Referring to the example set forth in FIG. 2, the negation of PG 92 indicates that a standby mode is entered.

Stage 320 is followed by stage 330 of determining whether to supply power to at least a portion of the memory circuit in response to a state of the memory circuit prior the receiving of the low power mode indication. Referring to the example set forth in FIG. 2, the first register cell of flip-flop 100 is shut down during a standby mode while the second register cell can receive power in response to its state prior entering the low power mode.

Stage 330 is followed by stage 340 of selectively providing power to at least a portion of the memory circuit, in response to the determination.

According to various embodiments of the invention method 300 can includes a stage of configuring the reset state of one or more memory circuits such as to reduce power consumption. For convenience of explanation this stage is not illustrated in FIG. 4.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for reducing power consumption of transistor-based circuit, the method comprises:
   receiving a low power mode indication;
   determining whether to supply power to at least a portion of the transistor-based circuit based on a reset value of the transistor-based circuit and a state of the transistor-based circuit prior to the receiving of the low power mode indication; and
   selectively providing power to at least a portion of the transistor-based circuit based on the determination of whether to supply power to at least a portion of the transistor-based circuit.

2. The method according to claim 1 further comprising configuring the transistor-based circuit reset value such as to reduce power consumption.

3. The method according to claim 1, wherein determining comprises providing a feedback signal representative of the state of the transistor-based circuit to a power gating circuit.

4. The method according to claim 1, further comprising providing multiple transistor-based circuits and configuring their reset value such as to reduce power consumption of at a certain amount of transistor-based circuits during a low power state.

5. The method according to claim 4, wherein the certain amount exceeds a half of the multiple transistor-based circuits.

6. The method according to claim 4, wherein the certain amount of transistor-based circuits is shut down during the low power mode.

7. The method according to claim 1 wherein the transistor-based circuit is a memory circuit.

8. The method according to claim 7 wherein the portion comprises a register cell.

9. An apparatus for reducing power consumption of a transistor-based circuit, the apparatus being coupled to the transistor-based circuit, and is adapted to receive a low power mode indication, wherein the apparatus comprises:
   a determining circuit to determine whether to supply power to at least a portion of the transistor-based circuit based on a state of the transistor-based circuit prior the receiving of the low power mode indication; and
   a power gating circuit, adapted to selectively provide power to at least a portion of the transistor-based circuit in response to the determination of whether to supply power.

10. The apparatus according to claim 9, further comprising a reset circuit to affect the reset state of the transistor-based circuit.

11. The apparatus of claim 10 wherein the reset circuit is responsive to a state of the transistor-based circuit prior the receiving of the low power mode indication.

12. The apparatus according to claim 9, wherein the transistor-based circuit is a memory circuit.

13. The apparatus according to claim 9, wherein the portion comprises a register cell.

14. An integrated circuit comprising:
   multiple transistor-based circuits, comprising:
      multiple apparatuses for reducing power consumption of the multiple transistor-based circuits, wherein each apparatus comprises a determining circuit to determine whether to supply power to at least a portion of the multiple transistor-based circuits based on a state of the multiple transistor-based circuits prior the receiving of the low power mode indication; and
   a power gating circuit; and
   wherein a reset value of the multiple transistor-based circuits is configured such as to reduce power consumption of at a certain amount of the multiple transistor-based circuits during a low power state.

15. The integrated circuit of claim 14, wherein the certain amount exceeds a half of the multiple transistor-based circuits.

16. The integrated circuit according to claim 14, wherein the certain amount of the multiple transistor-based circuits is shut down during the low power mode.

* * * * *